(12) United States Patent
Jha et al.

(10) Patent No.: US 6,816,876 B2
(45) Date of Patent: Nov. 9, 2004

(54) APPARATUS AND METHOD FOR MODIFYING AN M-SEQUENCE WITH ARBITRARY PHASE SHIFT

(75) Inventors: Uma Jha, Placentia, CA (US); Joel D. Medlock, Los Gatos, CA (US)

(73) Assignee: Infineon Technologies AG, Munich (DE)

( * ) Notice: Subject to any disclaimer, the term of this patent is extended or adjusted under 35 U.S.C. 154(b) by 591 days.

(21) Appl. No.: 09/772,581

(22) Filed: Jan. 29, 2001

(65) Prior Publication Data

US 2002/0013797 A1 Jan. 31, 2002

Related U.S. Application Data

(60) Provisional application No. 60/178,817, filed on Jan. 28, 2000.

(51) Int. Cl.[7] .................................................. G06F 1/02
(52) U.S. Cl. ...................................................... 708/252
(58) Field of Search ......................................... 708/252

(56) References Cited

U.S. PATENT DOCUMENTS

| | | | |
|---|---|---|---|
| 5,228,054 A | 7/1993 | Rueth et al. ................... 375/1 |
| 5,394,405 A | 2/1995 | Savir ............................ 371/27 |
| 5,784,427 A | 7/1998 | Bennett et al. ................ 377/72 |
| 5,878,075 A | 3/1999 | Frank et al. .................. 375/200 |
| 5,987,056 A | 11/1999 | Banister ....................... 375/200 |
| 6,339,781 B1 * | 1/2002 | Sasaki .......................... 708/252 |
| 6,388,583 B1 * | 5/2002 | Long et al. .................... 341/50 |
| 6,594,680 B1 * | 7/2003 | Gu et al. ...................... 708/256 |

* cited by examiner

*Primary Examiner*—D. H. Malzahn
(74) *Attorney, Agent, or Firm*—Darby & Darby

(57) ABSTRACT

An embodiment of the invention described in the specification and drawings is an apparatus and method of generating a phase-shifted maximum length pseudo-random noise (PN) sequence without resorting to complicated counters and clocking schemes. The apparatus includes a linear feedback shift register (LFSR) that has N stages and the ability to generate a first PN sequence at an output of its last stage. The LFSR is coupled to a first mask circuit and a second mask circuit for generating a second PN sequence and a third PN sequence. The apparatus further includes logic for selectively outputting bits from the second and third PN sequences to form a fourth PN sequence, which has a phase shift relative to the first PN sequence.

2 Claims, 6 Drawing Sheets

| A | B | C | D | E | F |
|---|---|---|---|---|---|
| LFSR_STATE | PN Sequence (at output 125) | Sequence A (Mask A = 0101) | Sequence B (Mask B = 1010) | SELECT | Output Sequence (at output 155) |
| 0001 | 1 | 1 | 0 | A | 1 |
| 1001 | 1 | 1 | 1 | A | 1 |
| 1101 | 1 | 0 | 1 | A | 0 |
| 1111 | 1 | 0 | 0 | A | 0 |
| 1110 | 0 | 1 | 0 | A | 1 |
| 0111 | 1 | 0 | 1 | A | 0 |
| 1010 | 0 | 0 | 0 | A | 0 |
| 0101 | 1 | 0 | 0 | B | 0 |
| 1011 | 1 | 1 | 0 | B | 0 |
| 1100 | 0 | 1 | 1 | B | 1 |
| 0110 | 0 | 1 | 1 | B | 1 |
| 0011 | 1 | 1 | 1 | B | 1 |
| 1000 | 0 | 0 | 1 | B | 1 |
| 0100 | 0 | 1 | 0 | B | 0 |
| 0010 | 0 | 0 | 1 | B | 1 |
| 0000 (forced-zero state) | 0 | 0 | 0 | B | 0 |
| 0001 | 1 | 1 | 0 | A | 1 |
| 1001 | 1 | 1 | 1 | A | 1 |
| 1101 | 1 | 0 | 1 | A | 0 |
| 1111 | 1 | 0 | 0 | A | 0 |
| ... | ... | .... | .... | ..... | ..... |

Fig. 5

APPARATUS AND METHOD FOR MODIFYING AN M-SEQUENCE WITH ARBITRARY PHASE SHIFT

This application claims priority to the provisional patent application entitled, "Apparatus and Method for Augmenting an M-sequence with Arbitrary Phase Shift," Ser. No. 60/178,817, filed Jan. 28, 2000.

BRIEF DESCRIPTION OF THE INVENTION

This invention relates to the generation of pseudo-random noise sequences. More particularly, this invention relates to modifying a pseudo-random noise sequence by either increasing or decreasing the length of the sequence. The invention is particularly useful in spread-spectrum wireless telecommunication systems and will be described in that context.

BACKGROUND OF THE INVENTION

Mobile stations of cellular and personal wireless communications systems need to acquire certain cell-specific information before negotiating service with a serving base station. The base stations are strategically placed in a geographical area (based on capacity and coverage requirements), and each base station transmits the necessary cell-specific information. In spread-spectrum systems, the cell-specific information is carried by the pilot and/or synchronization channels. The latter are spread with pseudo-random or Gold code sequences, which form the basis for mobile station frame, slot and bit timing synchronization. The sequences also identify the base station. At power-up, the mobile station needs to search over the set of known system-specific codes to identify the serving base station and to achieve frequency, time and frame/slot synchronization.

This necessitates that the mobile station be capable of storing or generating any such code. One approach involves the generation and manipulation of pseudo-random noise (PN) sequences. In particular, PN sequences are generated by an LFSR (Linear Feedback Shift Register) that includes N stages with some intervening exclusive-OR gates. The maximum length of a PN sequence generated by an LFSR with N-stages is $2^N-1$ bits. Depending on the structure of the LFSR, the generated PN sequence can also be $(2^N-1)/H$ bits long, where H is a factor of $(2^N-1)$. A maximal length PN sequence is also called an M-sequence.

A sequence length of $2^N-1$ is inconvenient because these numbers contain few factors and are frequently prime numbers. This makes it difficult to synchronize sequence generation with processes operating at a lower rate than the PN chip rate. Therefore, many spread-spectrum systems modify a generated code sequence such that its length changes from $2^N-1$ to $2^N$. Many spread-spectrum systems also include the code generation requirements of lengthening or shortening a PN sequence.

Prior art methods of lengthening or shortening PN sequences require undesirably complex control algorithms and hardware. Accordingly, there exists a need for a method and apparatus for lengthening or shortening PN sequences that does not require complex control algorithms and hardware.

SUMMARY OF THE INVENTION

An embodiment of the present invention is an apparatus for modifying a pseudo-random noise (PN) sequence with an arbitrary phase shift. The apparatus includes an N-stage linear feedback shift register (LFSR) that generates a first PN sequence. The LFSR is coupled to a first mask circuit and a second mask circuit for generating two additional PN sequences. The apparatus further includes logic for switching between the two additional PN sequences to form an output PN sequence having a phase shift relative to the first PN sequence output by the LFSR.

The method of one embodiment of the invention includes the steps of: generating a first PN sequence, generating two additional PN sequences, monitoring a state vector of the LFSR, outputting bits from a first additional PN sequence, outputting bits from a second additional PN sequence when the LFSR state vector matches a first pre-determined compare vector, and resuming output from the first additional PN sequence when the LFSR state vector matches a second pre-determined compare vector. The resulting output forms an output PN sequence having a phase shift relative to the first PN sequence.

Those skilled in the art will recognize a number of benefits associated with the disclosed technology. For example, one embodiment of the present invention provides generation of any phase-shifted PN sequence through the manipulation of two masked sequences. Functionality for both lengthening and shortening of a PN sequence is also provided. In addition, the control technique relies solely upon state comparisons to a reference state of the LFSR, without using a counter to keep track of the states of the LFSR.

Another benefit associated with the disclosed technology is that the same hardware architecture can be used to both lengthen and shorten a PN sequence.

Yet another benefit of the disclosed system is that the disclosed system may allow reconfiguration for various code requirements, and may utilize simplistic control strategies.

BRIEF DESCRIPTION OF THE DRAWINGS

For a better understanding of the invention, reference should be made to the following detailed description taken in conjunction with the accompanying drawing(s), in which:

FIG. 5 is a table demonstrating the generation of a phase-shifted pseudo-random noise sequence in accordance with an embodiment of the present invention.

Like reference numerals refer to corresponding parts throughout the drawing(s).

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it is understood that the description is not intended to limit the invention to these embodiments. Rather, the invention is intended to cover alternatives, modifications and equivalents, which may be included within the spirit and scope of the invention, as defined by the appended claims. Additionally, in the following detailed description of the present invention, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the present invention. Furthermore, while the present invention may be implemented in a digital wireless communication system in the present embodiment, the present invention is well suited to other applications. The digital wireless communication systems include, but are not limited to, fixed wireless, unlicensed (FCC) wireless, local area network (LAN), cordless telephony, cellular telephony, personal base station, and telemetry. Other applications include encryption, and other digital data processing applications.

Overview of an Embodiment of the Present Invention

Figure 1:
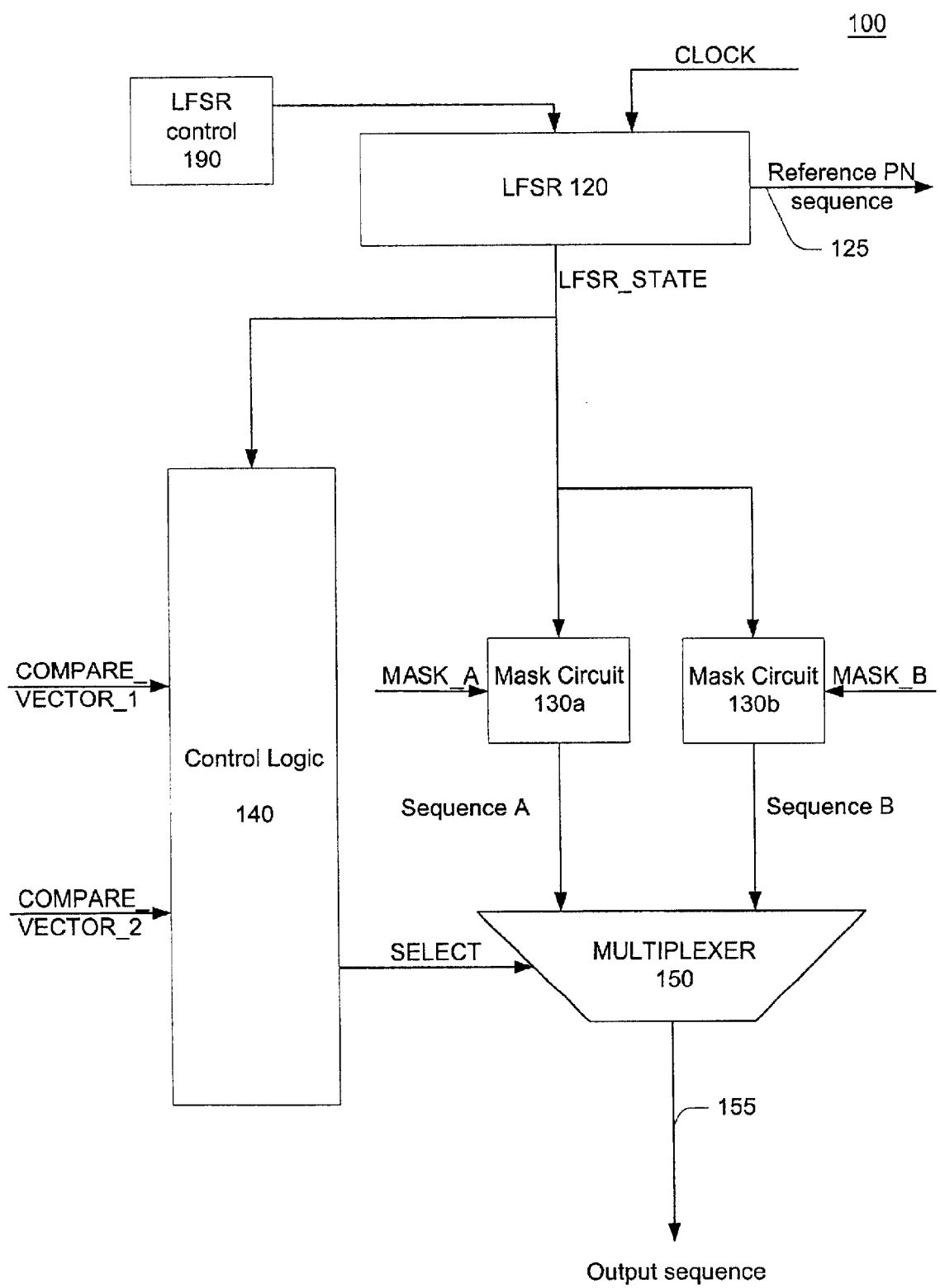
FIG. 1 is a block diagram illustrating an augmented pseudo-random noise sequence generator in accordance with an embodiment of the present invention.

FIG. 1 illustrates a pseudo-random noise (PN) sequence generator 100 in accordance with an embodiment of the present invention. As illustrated, sequence generator 100 includes a linear feedback shift register (LFSR) 120, mask circuits 130a–130b, a control circuit 140, and a multiplexer 150. The LFSR 120 includes N stages of storage elements. Thus, the LFSR 120 is capable of generating at output 125 a pseudo-random noise (PN) sequence with a maximum length of $2^N-1$ bits. Note that the LFSR 120 runs on a system clock signal, and generates one bit of the PN sequence each clock cycle at output 125. A period of each system clock cycle is herein referred to as a "chip" and the clock rate of the system clock is herein referred to as the "chip rate." At each system clock cycle, the LFSR 120 also generates an LFSR state vector (LFSR_STATE) that represents the outputs of the N stages of storage elements.

Also illustrated in FIG. 1 is an LFSR control circuit 190 that is coupled to the LFSR 120. One important function performed by the LFSR control circuit 190 is to "stall" the LFSR 120 for one clock cycle such that a PN sequence with a maximum length of $2^N$ bits can be generated at output 125. Control circuits for stalling an LFSR for the purposes of extending the PN sequence to $2^N$ bits are well known in the art of spread spectrum communication. Alternately, PN sequences can be extended by inserting an all-zero state into the LFSR 120, and by subsequently loading a natural sequence starting state into the LFSR 120.

It should be noted that the LFSR 120 is not limited to generating PN sequence that are 2N bits long. Rather, the LFSR 120 can be configured to generate PN sequences that are 2N/H bits long, where H is a factor of 2N. An apparatus for altering the configuration of the LFSR 120 to generate PN sequences of different lengths is described in co-pending U.S. patent application Ser. No. 09/751,782 filed Dec. 29, 2000, now U.S. Pat. No. 6,567,017, entitled "A Configurable Code Generator System for Spread Spectrum Applications," which is commonly assigned and incorporated herein by reference.

According to the present invention, the sequence generator 100 generates two additional PN sequences A and B. In the illustrated embodiment, PN sequence A is generated by masking the vector values of the LFSR state vector LFSR_STATE with a pre-determined mask A; and, the PN sequence B is generated by masking the vector values of LFSR_STATE with another pre-determined mask B. It should be note that, if LFSR 120 is not stalled, or if the all-zero state is not inserted in the LFSR, the PN sequences A and B are phase-shifted versions of the PN sequence produced at output 125. However, in the present embodiment, when a PN sequence with a maximum length of $2^N$ bits is produced (e.g., by stalling LFSR 120 or forcing an all-zero state), the sequences A and B are not phase-shifted versions of the PN sequence produced at output 125. Particularly, the sequences A and B may contain a fewer number of consecutive "zeros" that the PN sequence generated at output 125.

In order to generate PN sequences that contain the same number of "zeros" as the PN sequence at output 125, the sequences A and B are provided to the inputs of the multiplexer 150, which is controlled by control logic 140. Control logic 140 has an input for receiving the LFSR state vector LFSR_STATE, and inputs for receiving two pre-determined compare vectors, COMPARE_VECTOR_1 and COMPARE_VECTOR_2. The pre-determined compare vectors are specific to the structure of the LFSR 120 and the properties of the PN sequence to be generated. Control logic 140 compares the pre-determined compare vectors against the output state vector LFSR_STATE. Depending on the results of the comparison, the control logic 140 causes the multiplexer 150 to output either sequence A or sequence B. In other words, the multiplexer 150 switches between outputting the sequences A and B according to the comparison results between the LFSR state vector LFSR_STATE and the pre-determined compare vectors. As a result, a phase-shifted version of the PN sequence produced at output 125 can be generated at output 155 from multiplexer 150. By providing this switching functionality, the PN sequence generator 100 can generate PN sequences with any arbitrary phase-shift relative to the PN sequence produced at output 125.

Linear Feedback Shift Register

Figure 2:
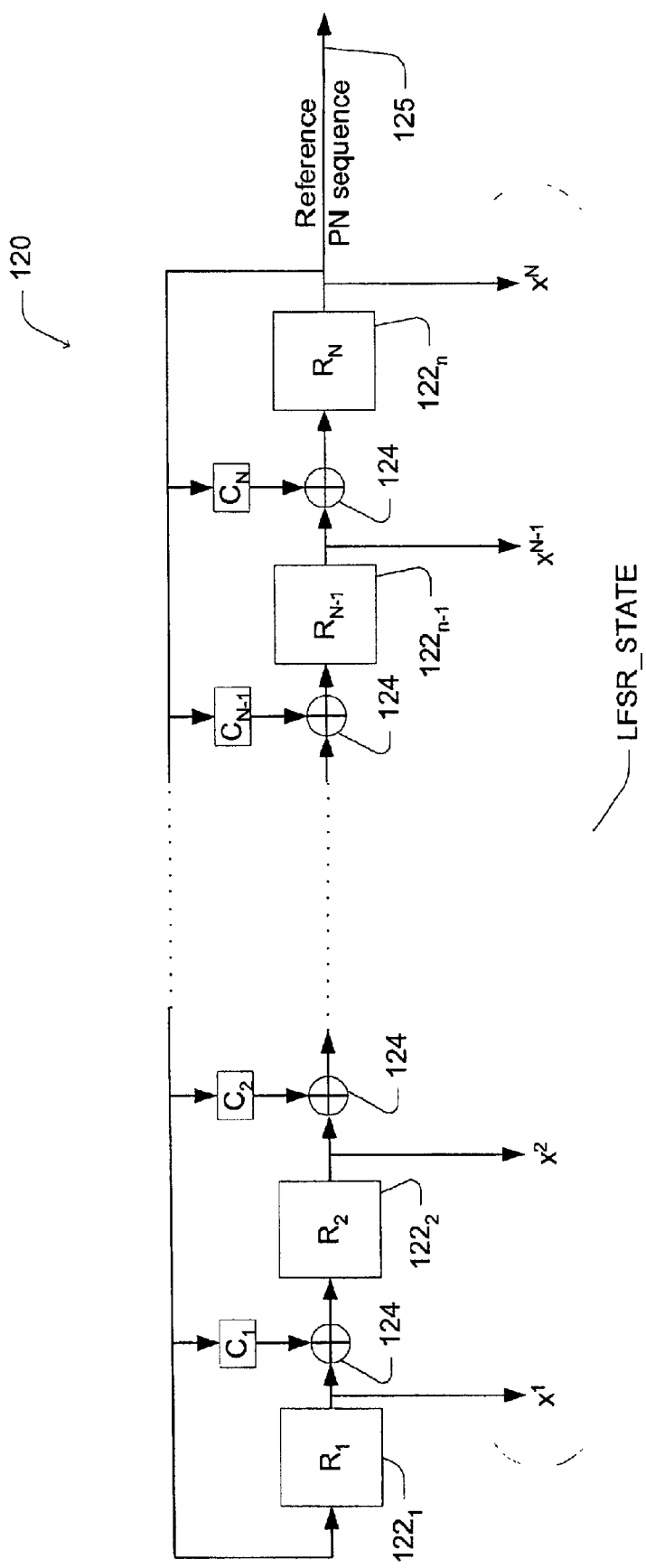
FIG. 2 is a block diagram illustrating an exemplary implementation of a Linear Feedback Shift Register (LFSR) of the augmented pseudo-random noise sequence generator of FIG. 1.

FIG. 2 depicts an exemplary implementation of LFSR 120 having N stages. The LFSR 120 includes a sequence of storage elements or shift register stages $122_1$–$122_N$ coupled in series with exclusive-OR gates or modulo-2 adders 124 disposed between the shift register stages. The binary storage devices of the LFSR 120 are designated in FIG. 2 as $R_1$, $R_2$, . . . , $R_N$ as each successive stage of the shift register. The output of the last stage $R_N$ is being fed back to each stage through the switches $\{c_i\}$. For instance, if N=15, then the maximum length of the PN sequence that LFSR 120 is capable of generating will be $2^{15}-1=32767$ bits. As illustrated in FIG. 2, LFSR 120 is configured to produce a PN sequence according to the polynomial of the following equation:

$$f(x)=1+c_1x+c_2x^2 \ldots +c_{N-2}x^{N-2}+c_{N-1}x^{N-1}+x^N$$

The coefficients $c_1, c_2, \ldots c_{N-1}$ of the polynomial play the role of "switches." The last stage $R_N$ is always fed back to the first stage $R_1$, and the output of stage $R_i$ is modulo-2 added to the output of the last stage $R_N$, provided that $c_i$ does not equal zero, and fed to the next stage, $R_{i+1}$. If $c_i$ equals zero, the output of stage $R_N$ is not added to the output of stage $R_i$ and the output of the stage Ri is directly shifted to the next stage. The output states of the stages $122_1$–$122_N$, representing the values $x^1$–$x^{15}$, are provided as the LFSR state vector LFSR_STATE.

Each stage $122_1$–$122_N$ has another input similarly coupled to a N-bit input bus 210 used for loading or initializing LFSR 120. Each bit of the N-bit value provided on N-bit input bus is loaded into a corresponding one of stages 122₁–122_N when each stage receives at another input a load enable signal 220.

To initiate the operation of the LFSR 120, an N-bit vector is loaded in the LFSR 120. The bit stored in each stage is shifted out of the stage in response to a system clock (not shown). A non-zero N-bit vector may produce $2^N-1$ distinct LFSR state vectors as the system clock moves on. Depending on the polynomial implemented by the LFSR 120, a non-zero N-bit vector may produce fewer than $2^N-1$ distinct LFSR state vectors.

When the output is taken from the last stage of the LFSR 120, the resulting sequence, which may have a maximum length of $2^N-1$ bits, is a pseudo-random noise (PN) sequence. Note that PN sequences may also be taken from any stage of the LFSR 120.

As mentioned, one way of extending the natural length of a PN sequence is by stalling the LFSR 120 for a clock cycle. Another way of extending the natural sequence is by loading an all-zero vector into the LFSR 120 at the end of the PN sequence, and subsequently loading a natural sequence starting state therein. By doing so, the resulting PN sequence can have a maximum length of $2^N$ bits.

A person of ordinary skill in the art will recognize that the LFSR 120 has a modular shift register generator (MSRG) configuration. In alternate embodiments of the present invention, LFSR 120 may have a simple shift register generator (SSRG) configuration. Both the MSRG and SSRG configurations are well known in the art, and their differences are not described herein to avoid obscuring aspects of the present invention.

Generation of Phase-Shifted Pseudo-random Noise Sequences

Figure 3:
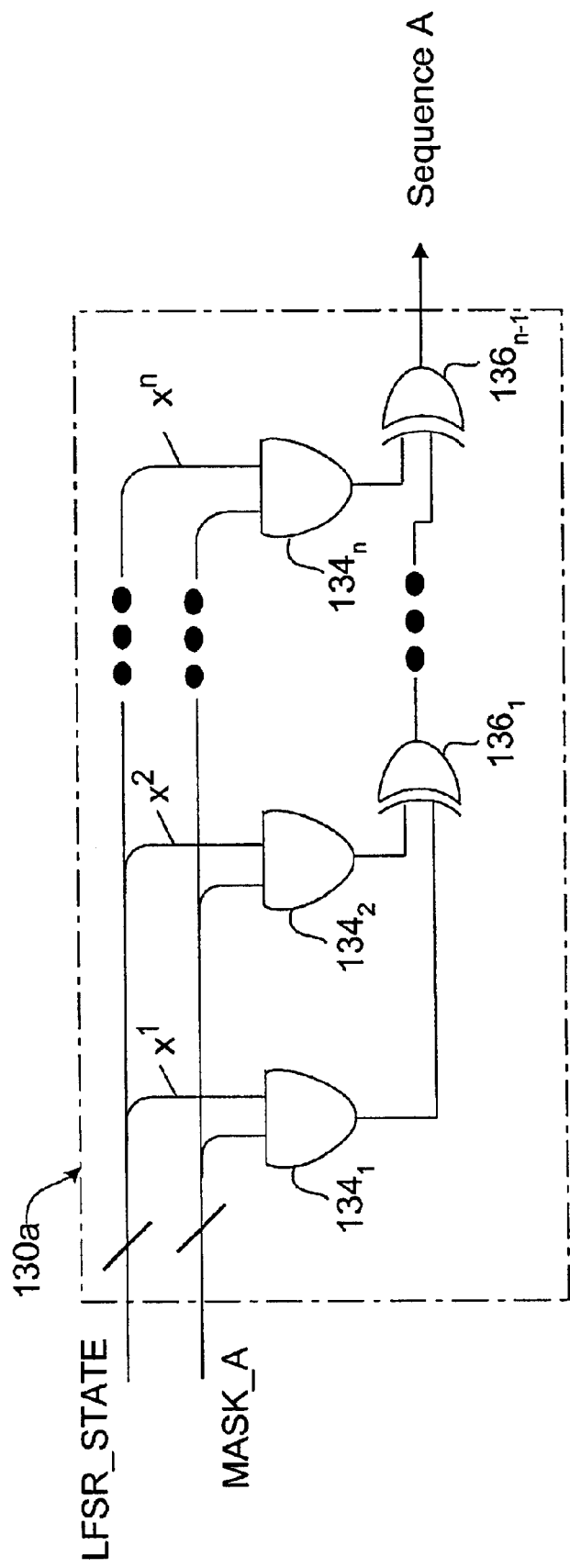
FIG. 3 illustrates in further detail an exemplary implementation of a mask circuit of the augmented pseudo-random noise sequence generator of FIG. 1.

FIG. 3 illustrates in further detail an exemplary implementation of mask circuit 130a for generating the PN sequence A. In FIG. 3, a sequence of AND gates 134₁–134_N each have one input for receiving a different bit of LFSR_STATE. For example, AND gates 134₁–134_n respectively receive from LFSR 120 the bits $x^1$–$x^N$ of LFSR_STATE. The other input of each of the AND gates 134₁–134_n receives a mask value MASK_A that selects a first set of the bits of LFSR_STATE to be exclusively-ORed. The output of each of AND gates 134₁–134_n is coupled to one input of one of cascaded exclusive-OR gates 136₁–136_{n-1}. The first exclusive-OR gate 136₁ has one input coupled to the output of AND gate 134₁, and a second input coupled to the output of AND gate 134₂. Each of the exclusive-OR gates 136 has an output coupled to an input of the next exclusive-OR gate 136 in the cascade. The output of the last exclusive-OR gate 136_{n-1} provides the PN sequence A. Mask circuit 130b may be similarly implemented using a mask value MASK_B to select a different set of the bits of LFSR_STATE to be exclusively-ORed.

As mentioned, if the LFSR 120 is not stalled during the generation of the PN sequence or if an all-zero state is not inserted, PN sequence A and PN sequence B will be phase-shifted versions of the reference PN sequence produced at output 125. However, when the LFSR 120 of the present embodiment is stalled, or when an all-zero state is inserted, PN sequence A and PN sequence B are not phase-shifted versions of the reference sequence produced at output 125. According to the present invention, this problem can be remedied by using a sequence switching circuit that includes the control logic 140 and the multiplexer 150.

Sequence Switching Circuit

Figure 4:
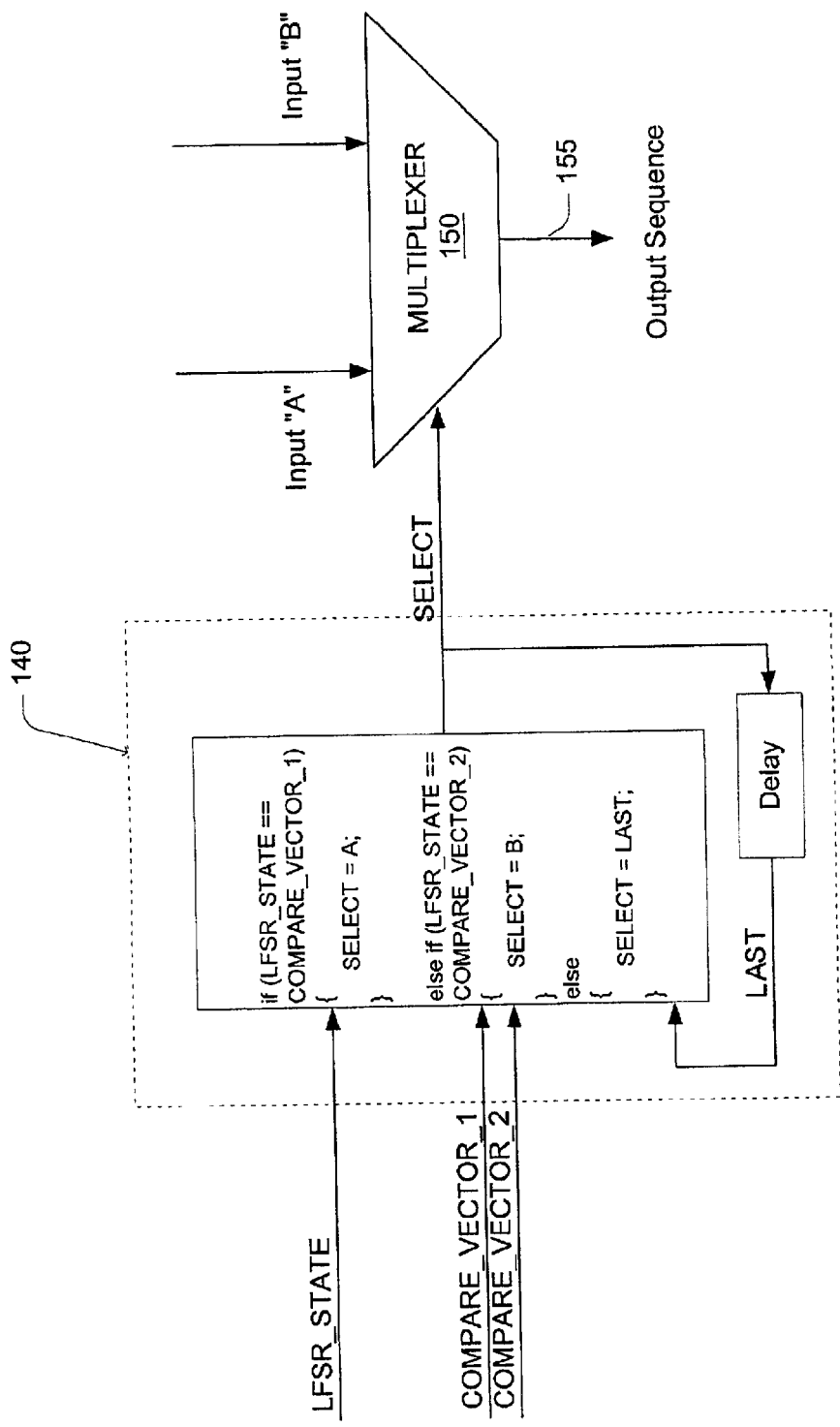
FIG. 4 is a block diagram illustrating an exemplary implementation of the control logic of the augmented pseudo-random noise sequence generator of FIG. 1.

FIG. 4 is a block diagram illustrating an exemplary implementation of control logic 140 and multiplexer 150 for selecting the sequence to be output. As illustrated, control logic 140 receives LFSR_STATE from LFSR 120, COMPARE_VECTOR_1 and COMPARE_VECTOR_2 as inputs, and provides a SELECT signal to the multiplexer 150. The multiplexer 150 has two inputs: input "A" for receiving sequence A, and input "B" for receiving sequence B. The SELECT signal is dependent on the LFSR state vector LFSR_STATE and the compare vectors COMPARE_VECTOR_1 and COMPARE_VECTOR_2. Specifically, the control logic 140 implements an algorithm that monitors the state of the LFSR 120, and generates a SELECT signal according to the comparison results between the LFSR state vector and the compare vectors. In the present embodiment, if LFSR_STATE equals COMPARE_VECTOR_1, then the SELECT signal will be toggled such that the "A" input of the multiplexer 160 is selected. If LFSR_STATE equals COMPARE_VECTOR_2, then the SELECT signal will be toggled such that the "B" input of the multiplexer 160 is selected. If LFSR_STATE does not equal to COMPARE_VECTOR_1 or COMPARE_VECTOR_2, then the previously selected sequence, which is indicated by the variable LAST, will be selected.

An exemplary algorithm for generating the SELECT signal, which is implemented by the control logic 140 in the present embodiment, is illustrated in Table 1 in pseudo-code format.

TABLE 1

```
If(LFSR_STATE = COMPARE_VECTOR_1)
{
    SELECT = A;
}
else if(LFSR_STATE == COMPARE_VECTOR_2)
{
    SELECT = B;
}
else
{
    SELECT = LAST;
}
```

It should be noted that the pseudo-code described in Table 1 is for illustrative purposes only, and that many other different implementations of the algorithm are possible. Furthermore, it should be appreciated that the pseudo-code of Table 1 can be implemented using logic gates in a manner known to those skilled in the art.

Example of Phase-Shifted PN Sequence Generation

FIG. 5 is a table demonstrating the generation of a PN sequence in accordance with an embodiment of the present invention. In the example of FIG. 5, a modular LFSR implementing the polynomial $$f(x)=1+x^3+x^4$$

is used. The LFSR_STATE vectors generated by the LFSR of the present example are set forth in column A of FIG. 5. The PN sequence generated at output 125 of the LFSR, which corresponds to the least significant bits of the LFSR_STATE vectors, is set forth in column B. A zero is forced into the reference sequence by loading the LFSR with an all zero state after state 0010. A mask value of 1010 is used to generate a sequence A; and, a mask value of 0101 is used to generate a sequence B. Sequences A and B are respectively set forth in columns C and D. Note that sequence A is not a phase-shifted version of the PN sequence of column B. Particularly, the longest run of consecutive zeros in sequence A is three while the PN sequence of column B contains a run of four consecutive zeros. The longest run of consecutive zeros in sequence B is also three. In the prior art, a complicated clocking scheme would have to be used in order to insert a zero in sequence A and sequence B such that sequence A and sequence B each contains a run of four consecutive zeros.

In the present embodiment, one compare vector can be set to 0101 and the other compare vector can be set to 0001. Thus, after the state 0101 is encountered, the SELECT signal can be toggled such that sequence B is selected by the multiplexer 150. Then, when LFSR_STATE reaches 0001, the SELECT signal is toggled again such that the sequence A is selected by the multiplexer 150. The toggling of the SELECT signal is shown in column E of FIG. 5. The resulting sequence output by the multiplexer 150 at output 155 is shown in column F. By comparing columns B and F, it will be apparent that the sequence output by multiplexer 150 has a phase shift of nine chips relative to the PN sequence produced at output 125. Thus, by choosing the appropriate mask values and compare vector values, an output sequence can be generated having an arbitrary phase-shift relative to the PN sequence produced at output 125. In addition, output sequences of different lengths can also be phase-shifted by similar mechanisms.

Note that, if a repeated LFSR state is used to augment the sequence, then there will be two occurrences of the same LFSR state for a given period. To overcome this problem, control logic, e.g., a bit flag, may be used such that the SELECT signal is toggled when the LFSR state matches the repeated LFSR state.

Alternate Embodiments

Figure 6:
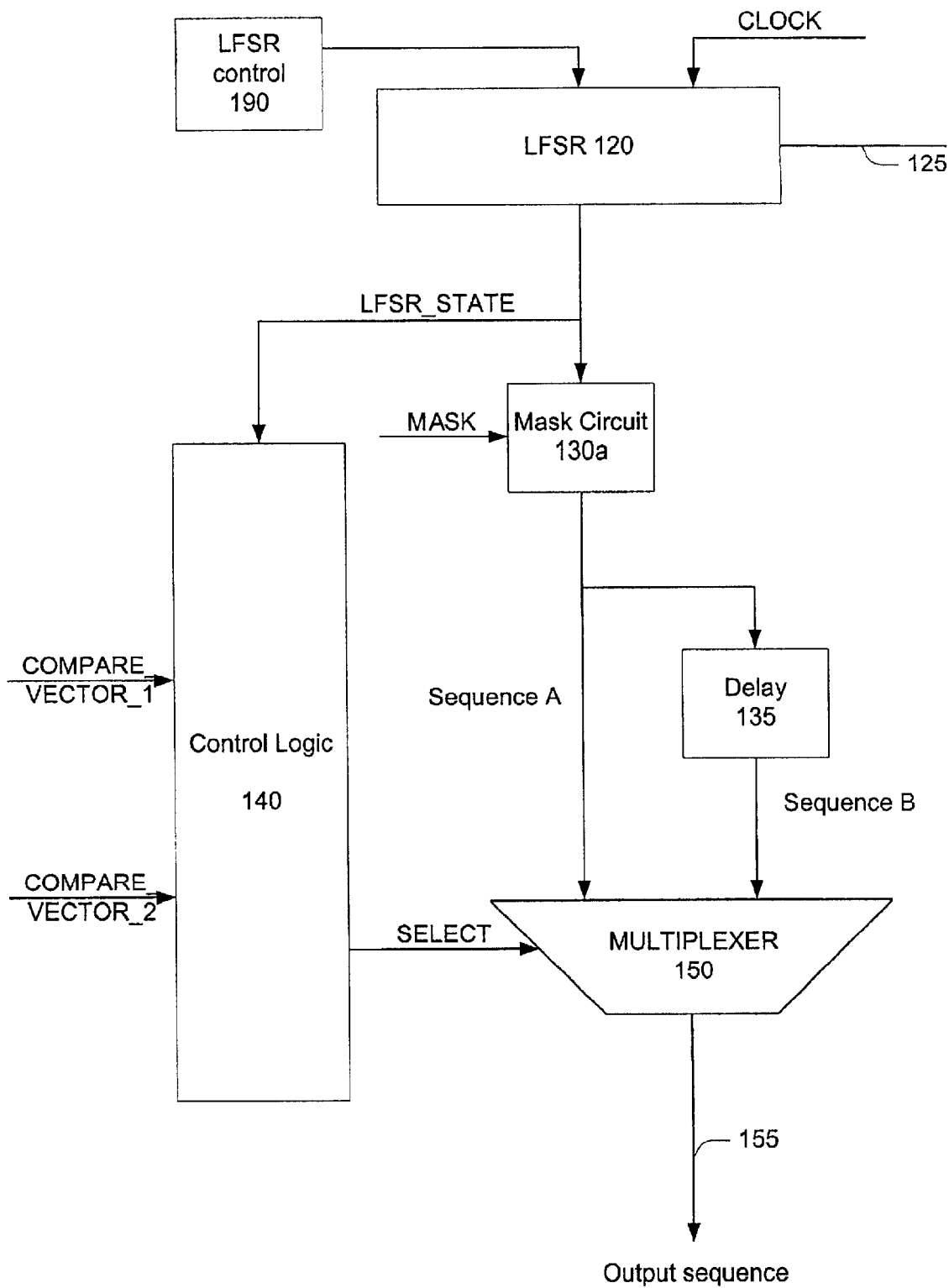
FIG. 6 is a block diagram illustrating an augmented pseudo-random noise sequence generator according to another embodiment of the present invention.

According to another embodiment of the present invention, a phase-shifted PN sequence can be generated with one mask circuit 130a. This embodiment is illustrated in FIG. 6. As shown, a first PN sequence is provided by mask circuit 130a to the multiplexer 150 and to a delay circuit 135. The delay circuit 135 delays the first PN sequence by one chip to form a second PN sequence, and provides the delayed sequence to the multiplexer 150, which is configured for outputting bits from either the first PN sequence or the second PN sequence. In this embodiment, the phase of the phase-shifted output PN sequence can be easily adjusted by using appropriate masks and compare vectors.

According to another embodiment of the present invention, a code generator having a single LFSR and multiple mask circuits that operate on the LFSR state vector can be used to generate multiple PN sequences, or multiple segments of PN sequences, that are offset relative to the PN sequence generated at the output of the last stage of the LFSR. The multiple sequences can then be applied to code/decode different traffic channels and/or "fingers" in a spread-spectrum communication system. Thus, only one LFSR is needed for multiple traffic channels. In contrast to conventional spread-spectrum communication systems where an individual dedicated LFSR is required for each "finger," a significant amount of hardware can be saved.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. In a pseudo-random sequence generator having a linear feedback shift register (LFSR) that has a plurality of stages connected so as to generate a first pseudo-random sequence at an output of the last stage of the LFSR and to generate a sequence of vectors each constituting the output of at least some of the stages of the LFSR, a method comprising the steps of:

selectively combining vector values of each vector of the sequence of vectors in a first way to produce a second pseudo-random sequence by exclusive-ORing a first set of vector values of each vector of the sequence of vectors;

selectively combining vector values of each vector of the sequence of vectors in a second way to produce a third pseudo-random sequence by exclusive-ORing a second set of vector values of each vector of the sequence of vectors, wherein the second set of vector values is different from the first set of vector values; and selectively outputting bits of the second pseudo-random sequence and at least one bit of the third pseudo-random sequence to form a fourth pseudo-random sequence, wherein the fourth pseudo-random sequence differs from the first pseudo-random sequence.

2. A pseudo-random sequence generator, comprising:

a linear feedback shift register (LFSR) having a plurality of stages, the LFSR generating a first pseudo-random sequence and generating a sequence of vectors each constituting the output of at least some of the stages of the LFSR;

a first mask circuit coupled to receive the sequence of vectors, the first mask circuit generating a second pseudo-random sequence by selectively combining vector values of each vector of the sequence of vectors, wherein the first mask circuit is configured for exclusive-ORing a first set of vector values of each vector of the sequence of vectors to generate the second pseudo-random sequence, a second mask circuit coupled to receive the sequence of vectors, the second mask circuit generating a third pseudo-random sequence by selectively combining vector values of each vector of the sequence of vectors, wherein the second mask circuit is configured for exclusive-ORing a second set of vector values of each vector of the sequence of vectors to generate the third pseudo-random sequence, where the second set of vector values is different from the first set of vector values; and logic circuits for generating a fourth pseudo-random sequence from the second pseudo-random sequence and the third pseudo-random sequence, wherein the fourth pseudo-random sequence comprises bits of the second pseudo-random sequence and at least one bit of the third pseudo-random sequence.

* * * * *